(12) United States Patent
Toong et al.

(10) Patent No.: US 11,083,089 B1
(45) Date of Patent: Aug. 3, 2021

(54) INTEGRATED DEVICE PACKAGE

(71) Applicant: Analog Devices International Unlimited Company, County Limerick (IE)

(72) Inventors: Teik Tiong Toong, Tanjung Tokong (MY); Sok Mun Chew, Pulau Pinang (MY); Chern Beng Kang, Bukit Mertajam (MY)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/815,536

(22) Filed: Mar. 11, 2020

(51) Int. Cl.
*H05K 7/00* (2006.01)
*H05K 1/18* (2006.01)
*H05K 3/34* (2006.01)

(52) U.S. Cl.
CPC .............. *H05K 1/185* (2013.01); *H05K 3/341* (2013.01); *H05K 2201/10454* (2013.01); *H05K 2201/10515* (2013.01)

(58) Field of Classification Search
USPC ........................................................ 361/760
See application file for complete search history.

(56) References Cited

U.S. PATENT DOCUMENTS

| 6,014,066 | A | 1/2000 | Harberts et al. | |
|---|---|---|---|---|
| 6,040,983 | A | 3/2000 | Baudouin et al. | |
| 6,418,029 | B1 | 7/2002 | McKee et al. | |
| 7,898,818 | B2 | 3/2011 | Kehoe | |
| 9,224,563 | B2 | 12/2015 | Itabashi et al. | |
| 2010/0084175 | A1* | 4/2010 | Suzuki ................. | H05K 1/0231 174/260 |
| 2015/0366063 | A1* | 12/2015 | Takagi ................. | H05K 1/145 361/743 |
| 2018/0324950 | A1 | 11/2018 | Nomura | |
| 2018/0332708 | A1 | 11/2018 | Lambert et al. | |
| 2019/0208643 | A1 | 7/2019 | Chuah et al. | |

* cited by examiner

*Primary Examiner* — Andargie M Aychillhum
(74) *Attorney, Agent, or Firm* — Knobbe, Martens, Olson & Bear, LLP

(57) ABSTRACT

A package is disclosed. The package includes a substrate and an electrical component vertically mounted to the substrate. The electrical component has a first end, a second end vertically spaced from the first end, and a side wall extending from the first end to the second end. The first end of the electrical component is positioned between the substrate and the second end of the electrical component. The package can also include a molding material disposed at least partially along the side wall of the electrical component.

20 Claims, 9 Drawing Sheets

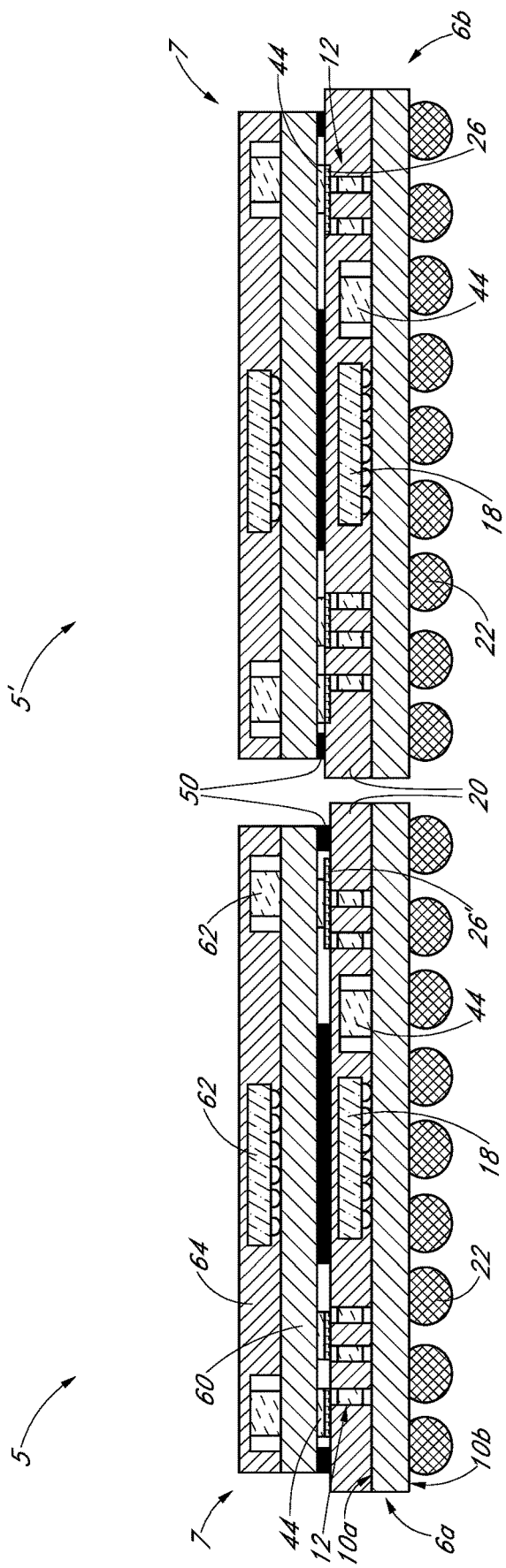

Area = 4.3mm²

% Area reduction = 39%

Area = 7mm²

INTEGRATED DEVICE PACKAGE

BACKGROUND

Field of the Invention

The field relates to integrated device packages, and in particular, to integrated device packages with a vertically mounted electrical component.

Description of the Related Art

An integrated device package can include a plurality of components (e.g., integrated device dies and passive components such as inductors, resistors, capacitors, etc.). The components are typically mounted on a package substrate. The package substrate can in turn be mounted to a system board. In some packages, it can be important to provide a small footprint, so as to enable the packages to fit within small form-factor electronic devices and systems.

SUMMARY

The innovations described in the claims each have several aspects, no single one of which is solely responsible for its desirable attributes. Without limiting the scope of the claims, some prominent features of this disclosure will now be briefly described.

In one aspect a package is disclosed. The package includes a substrate and an electrical component vertically mounted to the substrate. The electrical component has a longitudinal dimension, a transverse dimension that is generally perpendicular to the longitudinal dimension, a first end portion, a second end portion that is vertically spaced from the first portion along the longitudinal dimension of the electrical component, and a side wall that extends from the first end portion to the second end portion. The first end portion has a first polarity and is positioned between the substrate and the second end portion of the electrical component. The second end portion has a second polarity. The longitudinal dimension is greater than the transverse dimension. The package also includes a molding material that is disposed at least partially along the side wall of the electrical component.

In one embodiment, the longitudinal dimension of the electrical component is at least twice as long as the transverse dimension of the electrical component.

In one embodiment, the package further includes a second component mounted to the substrate. The second component can be vertically mounted to the substrate. The second component can have a third end portion and a fourth end portion that is vertically spaced from the third end portion. The third end portion of the second component is positioned between the substrate and the fourth end portion of the second component. The package can further include an interconnect structure that is electrically connecting the second portion of the electrical component and the fourth portion of the second component. The interconnect structure can include a conductive ink. The package can further include a third component that is electrically coupled to the substrate by way of the electrical component and the interconnect structure. The second component can have an integrated device die. The substrate can include an electrical pathway that electrically couples the electrical component and the second component.

In one embodiment, the package further includes a second component that is mounted over the electrical component. The second component is in electrical communication with the substrate through the electrical component.

In one embodiment, the substrate includes a printed circuit board.

In one aspect, a package is disclosed. The package includes a substrate, a first component vertically mounted to the substrate, and a second component vertically mounted to the substrate. The first component has a long side, a short side that is shorter than the long side, a first end portion, and a second end portion that is vertically spaced from the first end portion along the long side. The first end portion of the first component is mounted to the substrate and positioned between the substrate and the second end portion of the component. The second component has a third end portion and a fourth end portion that is vertically spaced from the third end portion. The third end portion of the second component is mounted to the substrate and positioned between the substrate and the fourth end portion of the second component. The package also includes an interconnect structure that electrically connects the second portion of the first component and the fourth portion of the second component.

In one embodiment, the interconnect structure is arranged so as to provide lateral electrical connection between the first component and the second component.

In one embodiment, the interconnect structure includes a conductive ink.

In one embodiment, the interconnect structure includes a passive device.

In one embodiment, The package further includes a molding material that is disposed at least partially between a first side wall of the first component that extends from the first end portion to the second end portion and a second side wall of the second component extending from the third end portion to the fourth end portion.

In one embodiment, the first component includes a passive component that has a positive terminal and a negative terminal.

In one aspect, a package is disclosed. The package includes a substrate, and an electrical routing means for providing an electrical pathway between a first portion of the substrate and a second portion of the substrate. The electrical routing means includes a first component vertically mounted to the first portion of the substrate. The first component has a long side, a short side that is generally perpendicular with the long side, a first terminal, and a second terminal that is spaced along the long side. The long side of the first component has a dimension that is greater than the shorter side of the first component. The first component is configured to provide a first vertical electrical path from the first portion of the substrate through the first terminal to the second terminal along the long side of the first component. The electrical routing means also includes a second component that is vertically mounted to the second portion of the substrate. The second component has a long side, a short side that is generally perpendicular with the long side, a third terminal, and a fourth terminal that is spaced along the long side. The long side of the second component has a dimension that is greater than the short side of second component. The second component is configured to provide a second vertical electrical path from the fourth terminal through the third terminal to the second portion of the substrate along the long side of the second component. The electrical routing means further includes an interconnect that electrically couples the second terminal of the first component and the fourth terminal of the second component. The interconnect is configured to provide a lateral electrical path between the first component and the second component.

In one embodiment, the first component incudes a passive component. The first terminal and the second terminal has opposite polarities.

In one embodiment, the package further includes a molding material disposed at least partially between the first component and the second component.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 7A is a schematic side cross-sectional view of a package that has a package on package configuration, according to one embodiment.

FIG. 7B is a schematic side cross-sectional view of a package that has a package on package configuration, according to another embodiment.

DETAILED DESCRIPTION

Figure 1:
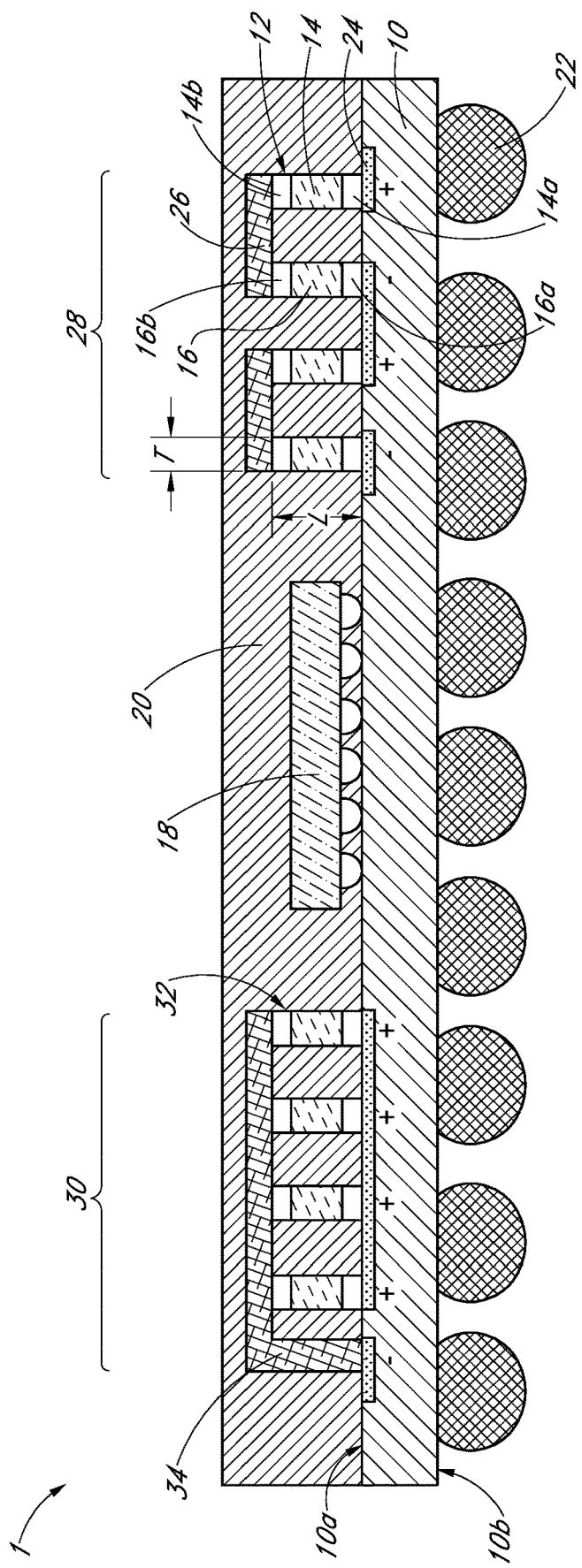
FIG. 1 is a schematic side cross-sectional view of a package according to one embodiment.

With the miniaturization of electronic devices, there is a strong demand for reducing a size of integrated device packages that are used in such electronic devices. Various embodiments disclosed herein relate to integrated device packages with a reduced footprint or lateral size. Various embodiments disclosed herein relate to integrated device packages with densely arranged components. An integrated device package can include a plurality of components. For example, an integrated device package can include a component (e.g., a passive component) that has a long side along a longitudinal dimension and a short side along a transverse dimension generally perpendicular to the longitudinal dimension. A passive component can include, for example, a capacitor, a resistor, an inductor, etc. The component can have a plurality of terminals (e.g., a positive terminal and a negative terminal) spaced apart along the longitudinal axis. In some arrangements, the component can be horizontally mounted to a substrate to connect both the positive terminal and the negative terminal to the substrate. In such horizontal mounting arrangements, the component can be mounted such that the longitudinal axis is disposed along the mounting surface, and both the positive and negative terminals may be mounted to the mounting surface. A footprint or a lateral size of the integrated device package can be driven by the longitudinal dimension of one or more components within the package, because in such packages the components are mounted with the longitudinal axis parallel to the mounting surface.

Various embodiments disclosed herein beneficially reduce the footprint of an integrated device package by vertically mounting one or more components within the package on a substrate. For example, in such embodiments, the longitudinal axis of the component can be disposed non-parallel (e.g., transverse to) the mounting surface (e.g., the substrate). In some embodiments, only one terminal (e.g. one of the positive terminal or the negative terminal) can be mounted to the mounting surface. The other terminal (e.g. the other of the positive terminal or the negative terminal) may not be mounted to the substrate. In some embodiments, the package with vertically mounted components can be advantageous for vertically stacking components.

A package according to various embodiments disclosed herein can include a package substrate, and a component that is vertically mounted on the substrate. The component can comprise an electrical component (e.g., a passive electrical component). The component can comprise a capacitor, a resistor, or an inductor. The package substrate can comprise any suitable type of package substrate. For example, the package substrate can comprise a laminate substrate (such as a printed circuit board, or PCB), a ceramic substrate, a lead frame substrate, etc. The package can comprise a molding material. The molding material can be disposed at least partially over the package substrate and can be used to at least partially cover the components of the package for protection. The molding material can be disposed at least partially along a side wall that vertically extends between a first end of the component to a second end of the component.

A package according to various embodiments disclosed herein can include a package substrate, a first component and a second component that are vertically mounted on the substrate. The components can comprise electrical components (e.g., a passive component). The components can comprise a capacitor, a resistor, or an inductor. The components can comprise a conductive component. The components can be laterally positioned to each other. The package can comprise an interconnect that electrically couples the first component and the second component.

FIG. 1 is a schematic side cross-sectional view of a package 1 according to one embodiment. The package 1 can include a package substrate 10 having a top side 10a, a bottom side 10b, a plurality of components 12 that includes a first component 14 and a second component 16 that are vertically mounted on the top side 10a of the package substrate 10, an integrated device die 18 mounted on the top side 10a of the package substrate 10, and a molding material 20 that is disposed over the top side 10a of the package substrate 10. The package 1 can also include a plurality of solder balls 22 for electrically and/or mechanically connecting the package 1 to, for example, an external substrate or a device (not illustrated).

The package substrate 10 can comprise any suitable type of package substrate. For example, the package substrate 10 can comprise a laminate substrate (such as a printed circuit board, or PCB), a ceramic substrate, a lead frame substrate, etc. The package substrate 10 can include an electrical pathway (e.g., a conductor or a trace 24) disposed in or on the package substrate 10. The trace 24 can be arranged such that two or more of the plurality of components 12 are electrically coupled.

The plurality of components 12 can comprise electrical components (e.g., a passive component). The plurality of components 12 can comprise conductive components (e.g., a metal pillar). In some embodiments, one or more of the plurality of components 12 can comprise a capacitor, a resistor, or an inductor. Each of the plurality of components 12 can have a long side along a longitudinal dimension L and a short side (shorter than the long side) along a transverse dimension T generally perpendicular to the longitudinal dimension. As illustrated in FIG. 1, longitudinal dimension L (e.g., the long side) of each of the plurality of components 12 extends generally vertically relative to the top side 10a of the package substrate 10. The longitudinal dimension L can be referred to as a length of the component 12 and the transverse dimension T can be referred to as a width of the component 12. The longitudinal dimension L is greater than the transverse dimension T. A relationship between the longitudinal dimension L and the transverse dimension T can be expressed by a ratio r. The ratio r can be calculated by the formula r=L/T. In some embodiments, the ratio r can be in a range from 1.1 to 5. In some embodiments, the ratio r can be in a range from, for example, 1.1 to 2, in a range from, for example, 1.1 to 4, in a range from, for example, 2 to 5, in a range from, for example, 3 to 5, or in a range from, for example, 3 to 4. In some embodiments, the longitudinal dimension L is at least twice as long as the transverse dimension T In some embodiments, the long side of a component 12 can be generally perpendicular to the top side 10a of the package substrate 10. In some embodiments, an angle between the top side 10a of the package substrate 10 can be in a range from 85° to 95°. In some embodiments, the long sides of the plurality of components 12 can be parallel. However, in some other embodiments, the long sides of one or more of the plurality of components 12 can be tilted during manufacturing processes such that the long sides of two or more of the plurality of components 12 are nonparallel. In some embodiments, the plurality of components 12 can have different dimensions, functions, and/or characteristics.

The first component 14 can have a first end 14a and a second end 14b. The first end 14a of the first component 14 can be mounted or coupled to a first portion of the top side 10a of the package substrate 10. In some embodiments, the first end 14a can be coupled to the top side 10a by way of an adhesive (e.g., solder paste) (not illustrated). The second component 16 can have a third end 16a and a fourth end 16b. The third end 16a of the first component 16 can be coupled to a second portion of the top side 10a of the package substrate 10. In some embodiments, the third end 16a can be coupled to the top side 10a by way of an adhesive (e.g., solder paste) (not illustrated). As illustrated, the first component 14 and the second component 16 can be laterally spaced from each other. The second end 14b of the first component 14 and the fourth end 16b of the second component 16 can be coupled by way of an interconnect structure 26. The first to fourth ends 14a, 14b, 16a, 16b can be at or near corresponding edges of the components 14, 16. The first to fourth ends 14a, 14b, 16a, 16b can also be referred to as end portions. In some embodiments, the edge portions can be offset from the edges.

In the embodiment of FIG. 1, the interconnect structure 26 comprises a bridge that laterally electrically connects the second end 14b to the fourth end 16b. The interconnect structure 26 can comprise any suitable conductive material. For example, the interconnect structure 26 can comprise a conductive slug or plate (e.g., a copper slug), or a conductive ink. For another example, the interconnect structure 26 can comprise a passive component. The interconnect structure 26 can provide a lateral electrical connection between the first component 14 and the second component 16.

The opposing ends 14a, 14b and 16a, 16b of the respective components 14, 16 can comprise terminals of opposite polarity. In some embodiments, the terminal can be positioned anywhere in the end portion of the component 14, 16. For example, the terminals can be on a bottom surface of the component 14, 16 facing the top side 10a of the substrate 10 when vertically mounted to the substrate 10, or on a side wall of the component 14, 16. In some embodiments, the first end 14a of the first component 14 can comprise a positive terminal of the first component 14 and the second end 14b of the first component 14 can comprise a negative terminal of the first component 14. In some embodiments, the third end 16a of the second component 16 can comprise a negative terminal of the second component 16 and the fourth end 16b of the second component 16 can comprise the positive terminal of the second component 16. In the illustrated package 1, a first set of components 28 on the right side can be electrically connected in series (a series arrangement). In the series arrangement, the first set of components 28 are coupled in electrical series—e.g., a negative terminal of a component is coupled to a positive terminal of another component such that the set of components 28 is in series electrically. For example, as shown in FIG. 1, the interconnect structure 26 can connect the negative terminal at the second end 14b of component 14 with the positive terminal at the fourth end 16b of the component 16. Thus, in a series arrangement, the interconnect structure 26 can connect two terminals of the components 14, 16 that are of opposite polarity.

On the other hand, a second set of components 30 on the left side can be electrically connected in parallel (a parallel arrangement). In the parallel arrangement, the second set of components 30 are coupled in parallel—e.g., a positive terminal of a component is coupled to a positive terminal of another component (for example by way of trace 24) and a negative terminal of the component is coupled to a negative terminal of the other component (for example by way of the interconnect structure 26). In some embodiments, the second set of components 30 can comprise a plurality of passive components 32 and a metal pillar 34. In the illustrated package 1, the metal pillar 34 is configured to bring a negative electrical path from negative terminals of the passive components 32 to the top side 10a of the package substrate 10. Although FIG. 1 illustrates positive and negative terminals at particular locations for the arrangements of the first and second sets 28, 30, skilled artisans would appreciate that the polarities can be switched.

The integrated device die 18 can comprise any suitable type of die. For example, the die 18 can comprise a processor die, a memory die, a microelectromechanical systems (MEMS) die, a sensor die, an optical die, etc. In some embodiments, the die 18 can be electrically coupled to one or more of the plurality of components 12. In some embodiments, the package 1 can include a plurality of dies (see, for example, FIGS. 4-8).

The molding material 20 can be provided over the top side 10a of the substrate 10, and over at least portions of the die 18 and the components 12. For example, the molding material 20 can be disposed at least partially along a side wall of a component of the plurality of components 12 (e.g., at least partially along the side walls of the components 14, 16). The molding material 20 can be disposed along a majority of the side wall of the component of the plurality of components 12. The molding material 20 can be disposed at least partially between the plurality of components 12. For example, in the illustrated embodiment, the molding material 20 can be disposed such that the plurality of components 12 are fully embedded in the molding material. In some embodiments, the molding material 20 can provide a mechanical or physical support for the plurality of components 12. In some embodiments, the molding material 20 can define at least a portion of an outer periphery of the package 1. Beneficially, orienting the components 12 in a vertical direction can reduce the lateral footprint of the package 1 as compared to packages in which the same components 12 would be mounted laterally or horizontally.

Figure 2:
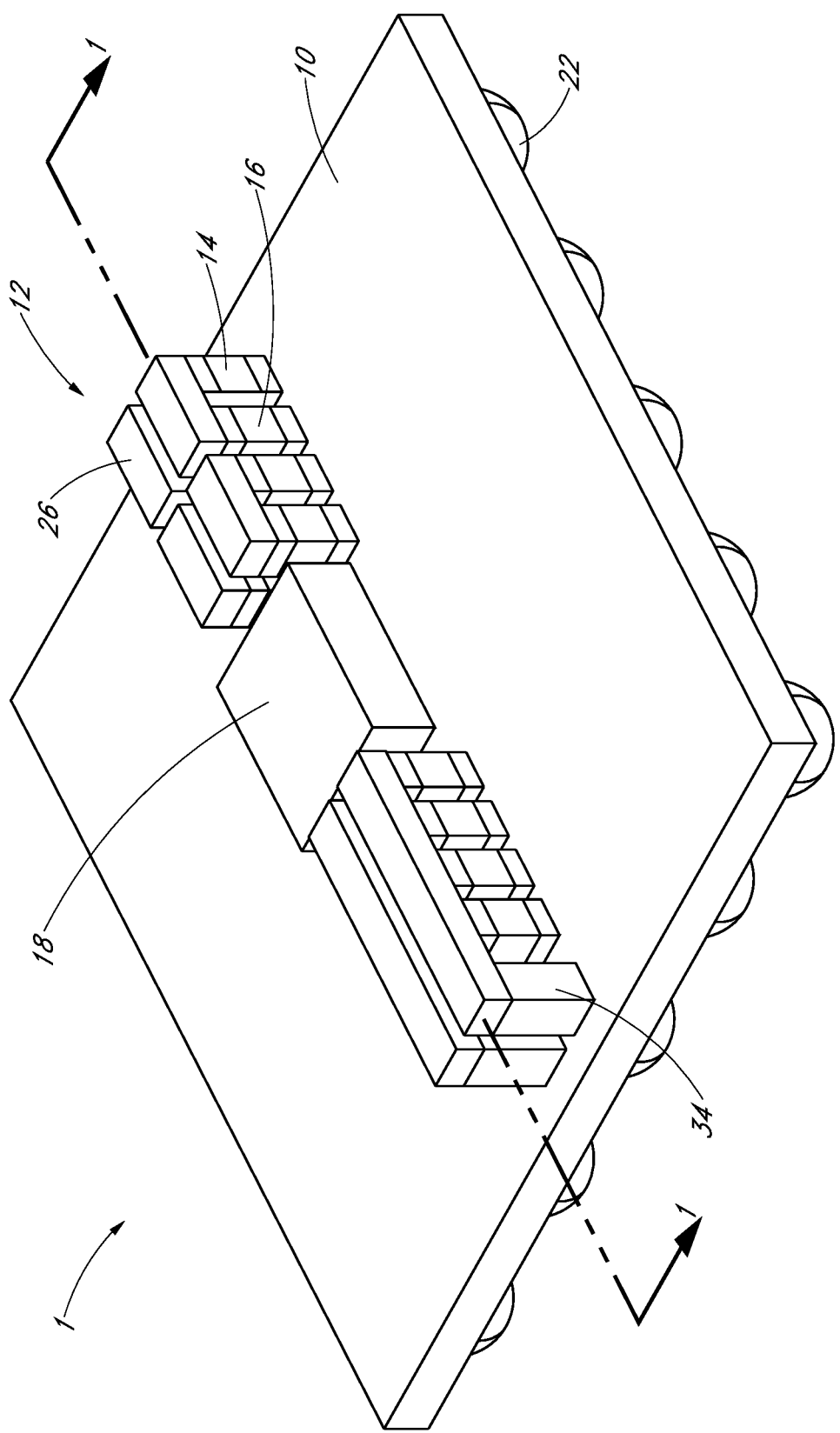
FIG. 2 is a schematic perspective view of the package illustrated in FIG. 1.

FIG. 2 is a schematic perspective view of the package 1 illustrated in FIG. 1. FIG. 2 does not illustrate the molding material 20 for ease of illustration to show the components embedded within the molding material 20. In the illustrated package 1, there are portions of the package substrate 10 where no component is provided. However, the package 1 can include additional one or more suitable components. For example, the package 1 can include components such as integrated device(s), integrated device die(s) (such as process dies, memory dies, microelectromechanical systems (MEMS) dies, sensor dies, optical dies, etc.), integrated circuit(s), passive electronic components (e.g., resistors, capacitors, inductors, etc.), a heat sink or heat slug, an integrated device package, or any other suitable type of device or component.

3A-3E illustrate schematic side cross-sections showing a process flow of manufacturing the package 1 illustrated in FIGS. 1 and 2. Though the process flow is specific to the package 1, similar processes can be used to manufacture any other embodiments of the package disclosed herein.

Figure 3A:
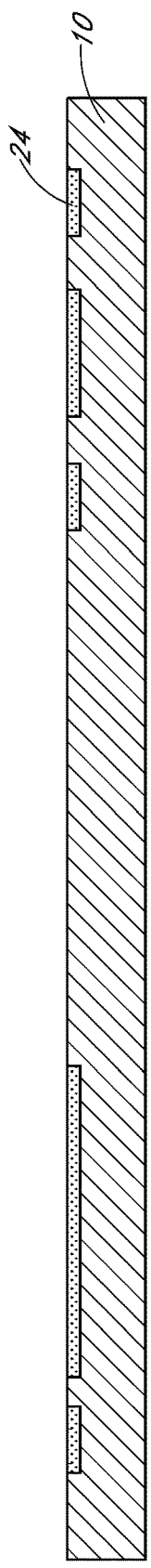
FIG. 3A illustrates schematic side cross-section showing a step in a process flow of manufacturing the package illustrated in FIGS. 1 and 2.

FIG. 3A illustrates a schematic side cross-sectional view of a package substrate 10. The package substrate can include an electrical pathway (e.g., a conductor or a trace 24) disposed in and/or on the package substrate 10. Additional electrical pathways can be provided in the package substrate 10. For example, additional vertical and/or horizontal traces can be embedded in the substrate 10 to transfer signals across and/or through the substrate. The traces can electrically connect the components 12 and die 18 with the solder balls 22. In some embodiments, the package 1 described herein can be manufactured in a wafer-level process, in which the package substrate 10 can comprises a wafer and the portions of the wafer shown in FIGS. 3A-3E can be diced or singulated after assembly. In some embodiments, the package 1 can be formed after singulating the package substrate 10.

Figure 3B:
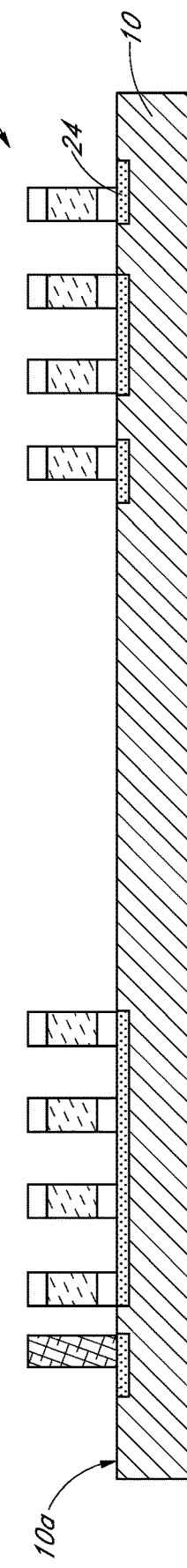
FIG. 3B illustrates a schematic side cross-section showing another step in a process flow of manufacturing the package illustrated in FIGS. 1 and 2.

In FIG. 3B, a plurality of components 12 are mounted on a top side 10a of the package substrate 10. The plurality of components 12 can comprise electrical components (e.g., a passive component). The plurality of components 12 can comprise conductive components (e.g., a metal pillar). Prior to mounting the plurality of components 12 to the top side 10a of the package substrate 10, a conductive adhesive (e.g., solder) can be provided on portions of the top side 10a of the package substrate 10 by way of, for example, solder printing. The plurality of components 12 can be vertically mounted to the top side 10a of the package substrate 10 by way of the conductive adhesive. In the illustrated embodiment, the ends of the components 12 mounted to the substrate 10 can comprise one or more terminals of the component 12, and the terminals can be electrically connected to the substrate 10 by way of the conductive adhesive.

Figure 3C:
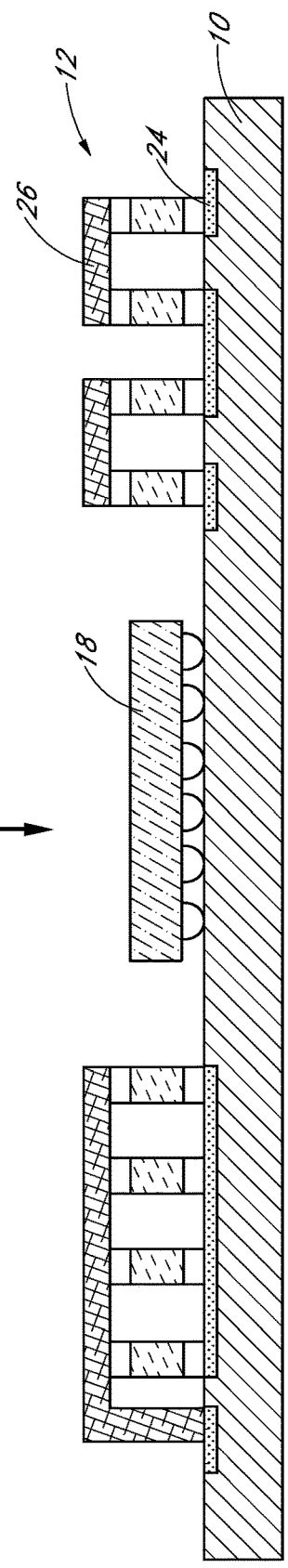
FIG. 3C illustrates a schematic side cross-section showing another step in a process flow of manufacturing the package illustrated in FIGS. 1 and 2.

In FIG. 3C, an interconnect structure 26 and a die 18 are provided. The interconnect structure 26 can comprise a conductive segment. In some embodiments, a plurality of interconnect structures 26 can be provided. Each of the plurality of interconnect structures 26 can be spaced apart from each other. The interconnect structure 26 can serve as an electrical bridge to electrically couple two or more terminal of the plurality of components 12. In some embodiments, the interconnect structure 26 can comprise a conductive slug or plate (e.g., a copper slug). In the process flow of manufacturing the package 1 illustrated in FIGS. 3A-3E, a copper slug is used as the interconnect structure 26. In some embodiments, a solder paste can be provided between the interconnect structure 26 and the plurality of components 12.

The die 18 can comprise any suitable type of integrated device die. For example, the dies 18 can comprise a process die, a memory die, a microelectromechanical systems (MEMS) die, a sensor die, an optical die, etc. Though only one die 18 is illustrated, additional dies can be provided on the package substrate 10. The die 18 can be mounted to the package substrate 10 in any suitable manner. For example, the die 18 can be mounted to the package substrate 10 by way of flip chip connection (in which a conductive adhesive such as solder connect the die 18 to the substrate 10) or wire bonding (in which bonding wires electrically connect the die 18 to the substrate 10).

Figure 3D:
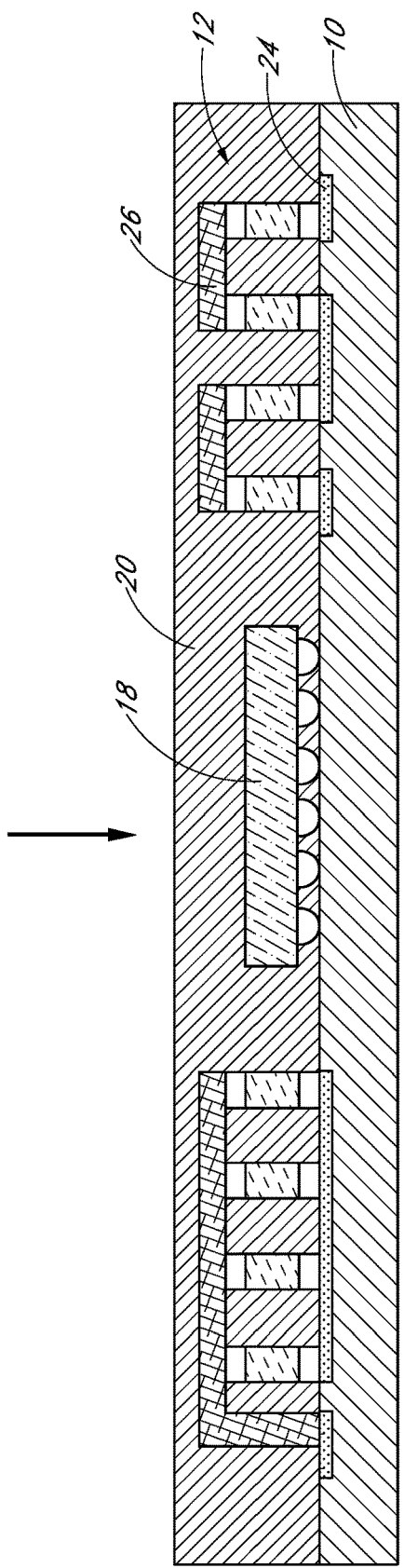
FIG. 3D illustrates a schematic side cross-section showing another step in a process flow of manufacturing the package illustrated in FIGS. 1 and 2.

In FIG. 3D, a molding material 20 is provided on the top side 10a of the substrate 10 over the components 12 and the die 18. The molding material 20 can be disposed at least partially along a side wall of a component of the plurality of components 12. The molding material 20 can be disposed along a majority of the side wall of the component of the plurality of components 12. The molding material 20 can be disposed at least partially between the plurality of components 12. The molding material 20 can be disposed such that the plurality of components 12 are fully embedded in the molding material. In some embodiments, the molding material 20 can provide a mechanical or physical support for the plurality of components 12. In some embodiments, the molding material 20 can define at least a portion of an outer periphery of the package 1. In some embodiments, the molding material 20 can be thinned or cleaned. For example, the molding material 20 can be grinded, laser ablated or laser deflashed. The molding material can comprise any suitable type of insulating overmold, such as an epoxy.

In some embodiments, the interconnect structure 26 can be provided after a molding material 20 is provided. In such embodiments, at least a portion of the molding material 20 can be removed to expose one or more of the plurality of components 12. The portion of the molding material 20 can be removed by way of, for example, laser ablation, surface or strip grinding, laser deflash, etc. In some applications, such embodiments can provide more freedom to forming the interconnect structure 26. For example, a conductive ink can be used for forming the interconnect structure 26 in such embodiments. The conductive ink can be applied using a screen print process.

Figure 3E:
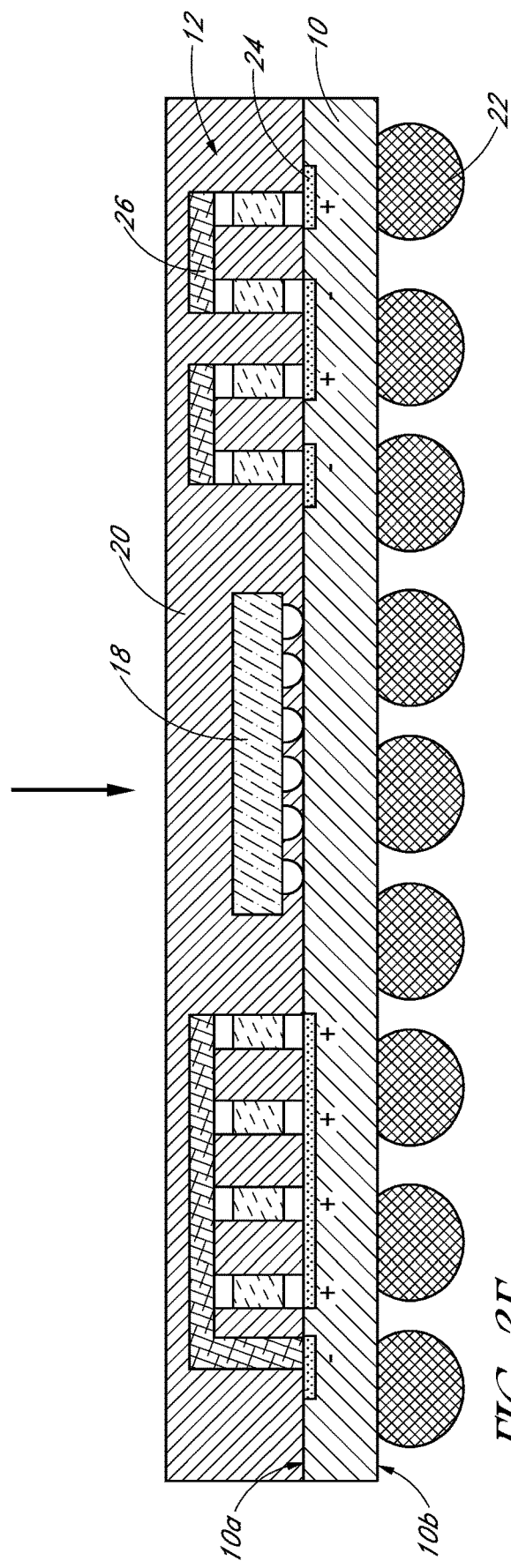
FIG. 3E illustrates a schematic side cross-section showing another step in a process flow of manufacturing the package illustrated in FIGS. 1 and 2.

In FIG. 3E, a plurality of solder balls 22 can be provided on a bottom side 10*b* of the package substrate 10. The plurality of solder balls 22 can electrically and/or mechanically connect the package 1 to, for example, an external substrate or a device (not illustrated). As briefly discussed above, the package 1 can be diced or singulated in arrangements that utilize a wafer-level process. The order of the process flow can change for other embodiments disclosed herein.

Figure 4:
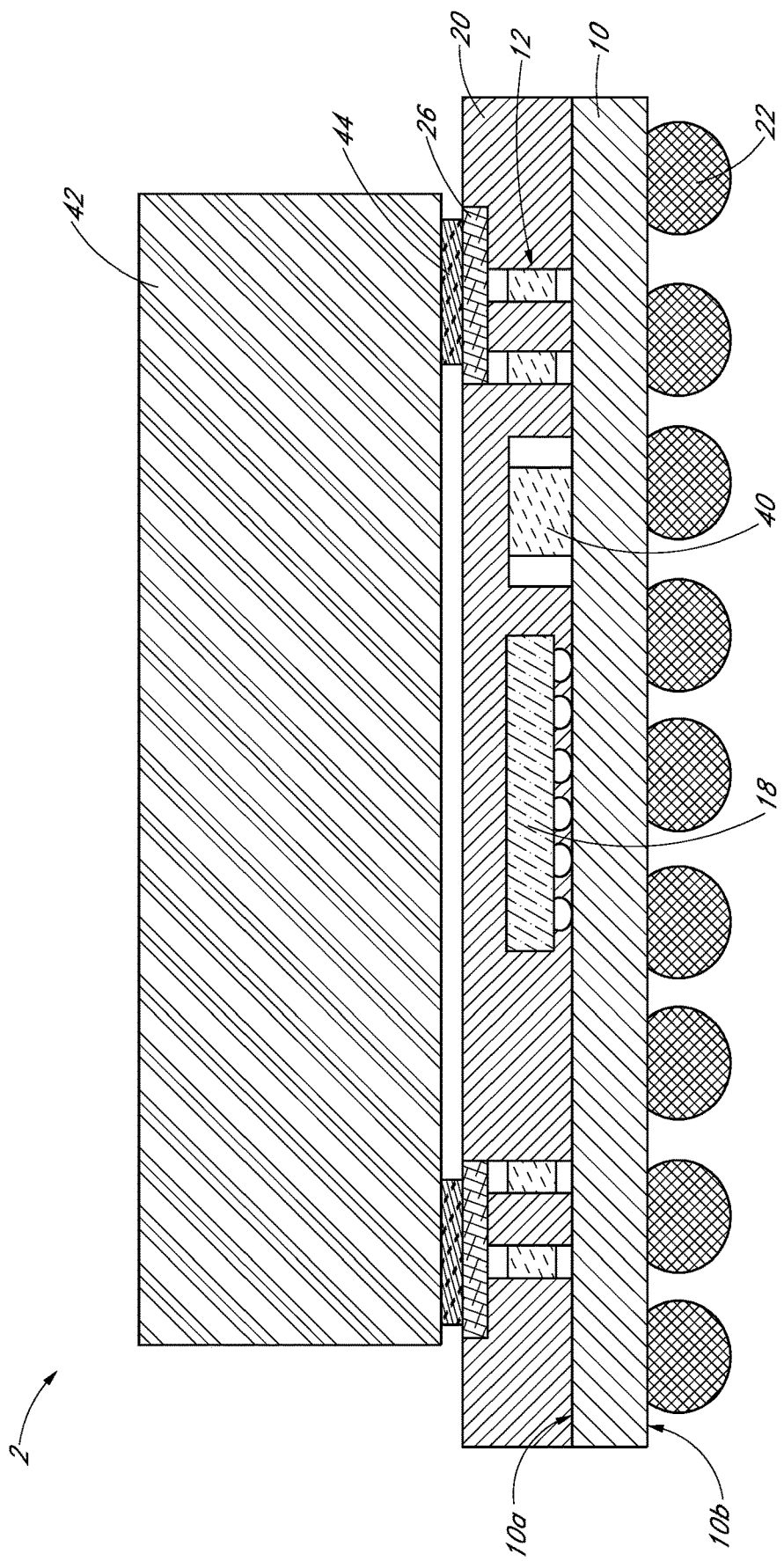
FIG. 4 is a schematic side cross-sectional view of a package according to one embodiment.

FIG. 4 is a schematic side cross-sectional view of a package 2 according to one embodiment. Unless otherwise noted, components of FIG. 4 may be the same as or generally similar to like-numbered components of FIGS. 1-3E. The package 2 can include a package substrate 10 having a top side 10*a*, a bottom side 10*b*, a plurality of components 12 that are vertically mounted on the top side 10*a* of the package substrate 10, a die 18 mounted on the top side 10*a* of the package substrate 10, a horizontally mounted component 40, and a molding material 20 that is disposed over the top side 10*a* of the package substrate 10. The plurality of components 12 can be electrically connected by a conductive structure 26. In FIG. 4, a metal slug is illustrated as the conductive structure 26. The package 2 can also include a plurality of solder balls 22 for electrically and/or mechanically connecting the package 2 to, for example, an external substrate or a device (not illustrated). The package 2 can further include a component 42 mounted to an upper surface of the molding compound 20 opposite the substrate 10 and that is coupled to one or more of the vertically mounted plurality of components 12.

In some embodiments, the horizontally mounted component 40 can comprise electrical components (e.g., a passive component). In some other embodiments, the horizontally mounted component 40 can comprise any suitable die such as an integrated device die. For example, the dies 40 can comprise a process die, a memory die, a microelectromechanical systems (MEMS) die, a sensor die, an optical die, etc.

In some embodiments, the component 42 can comprise an electrical component (e.g., a passive component or an active component). In some embodiments, the component 42 can comprise a thermally-conductive component (e.g., a heat sink). A conductive adhesive 44 (e.g., solder) can be disposed between the component 42 and the interconnect structure 26. The conductive adhesive 44 can be provided on the interconnect structure 26 by way of, for example, solder printing. At least one of the plurality of components 12, the conductive structure 26 and the conductive adhesive 44 can electrically connect the package substrate 10 and the component 42. Therefore, in some embodiments, one or more of the plurality of components 12 can serve to transfer electrical signals through the molding material 20 to the substrate 10. The components 12 (which may comprise passive electronic components) can also act upon the signals to condition or otherwise process the signals.

In some embodiments, at least a portion of the molding material 20 can be removed to expose at least a portion of the interconnect structure 26 or one or more of the plurality of components 12 during a manufacturing process. The portion of the molding material 20 can be removed by way of, for example, laser ablation, surface or strip grinding, laser deflash, etc. The exposed portion of the interconnect structure 26 or one or more of the plurality of components 12 can be at least partially covered with the conductive adhesive 44 for bonding the component 42. In the package 2 illustrated in FIG. 4, the component 42 and the molding material 20 can be spaced apart, for example, by the intervening adhesive 44 and by a gap between the component 42 and the molding material 20. However, in some embodiments, the component 42 and the molding material 20 can be in contact. In some other embodiments, there can be an intervening material (e.g., an adhesive) between the component 42 and the molding material 20 along the length of the component 42, including at locations outside the connection to the interconnect structures 26.

Figure 5:
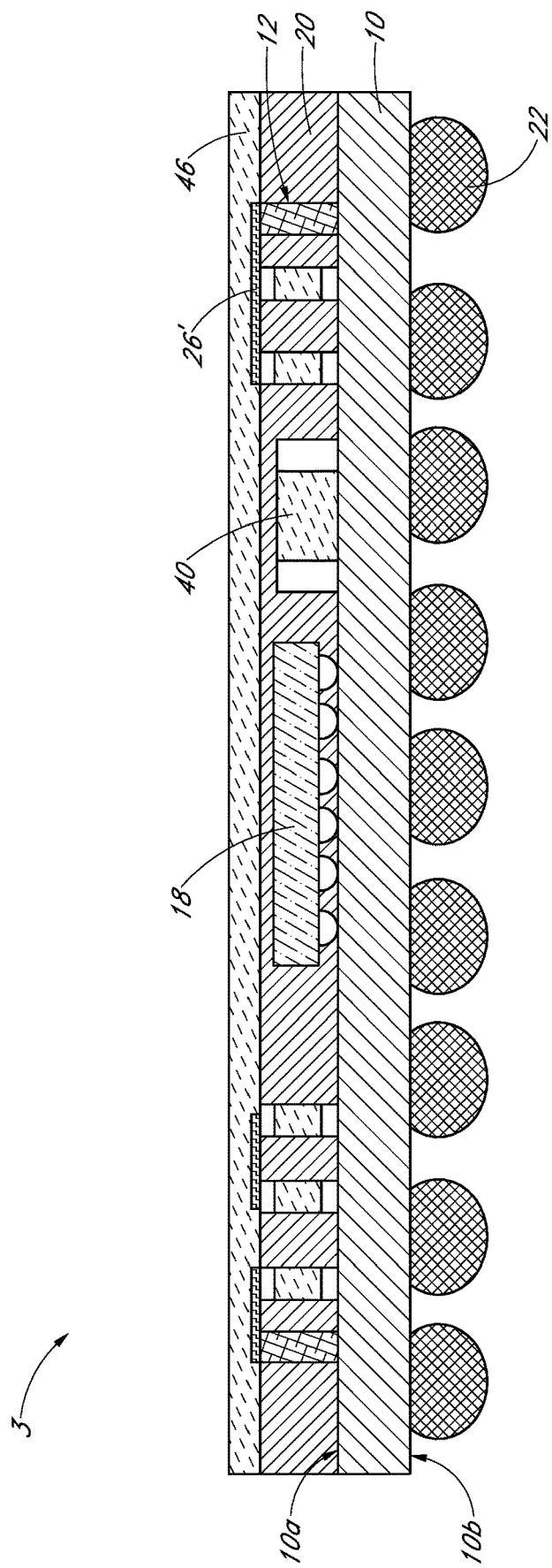
FIG. 5 is a schematic side cross-sectional view of a package according to another embodiment.

FIG. 5 is a schematic side cross-sectional view of a package 3 according to one embodiment. The package 3 can include a package substrate 10 having a top side 10*a*, a bottom side 10*b*, a plurality of components 12 that are vertically mounted on the top side 10*a* of the package substrate 10, a die 18 mounted on the top side 10*a* of the package substrate 10, a horizontally mounted component 40, and a molding material 20 that is disposed over the top side 10*a* of the package substrate 10. The plurality of components 12 can be coupled by way of an interconnect structure 26'. In FIG. 5, a conductive ink is illustrated as the interconnect structure 26'. The package 3 can also include a plurality of solder balls 22 for electrically and/or mechanically connecting the package 3 to, for example, a substrate or a device (not illustrated). The package 3 can further include a protective layer 46 over at least a portion of the interconnect structure 26'.

The protective layer 46 can comprise any suitable nonconductive material for protecting the interconnect structure 26'. In some embodiments, the protective layer 46 can mitigate or prevent the interconnect structure 26' from shorting to components outside the package. As shown, the interconnect structure 26' can be at least partially embedded in the protective layer 46. Is some embodiments, the protective layer 26' can comprise a passivation layer (e.g., an inorganic dielectric such as silicon oxide), an epoxy or other type of insulating layer.

Figure 6:
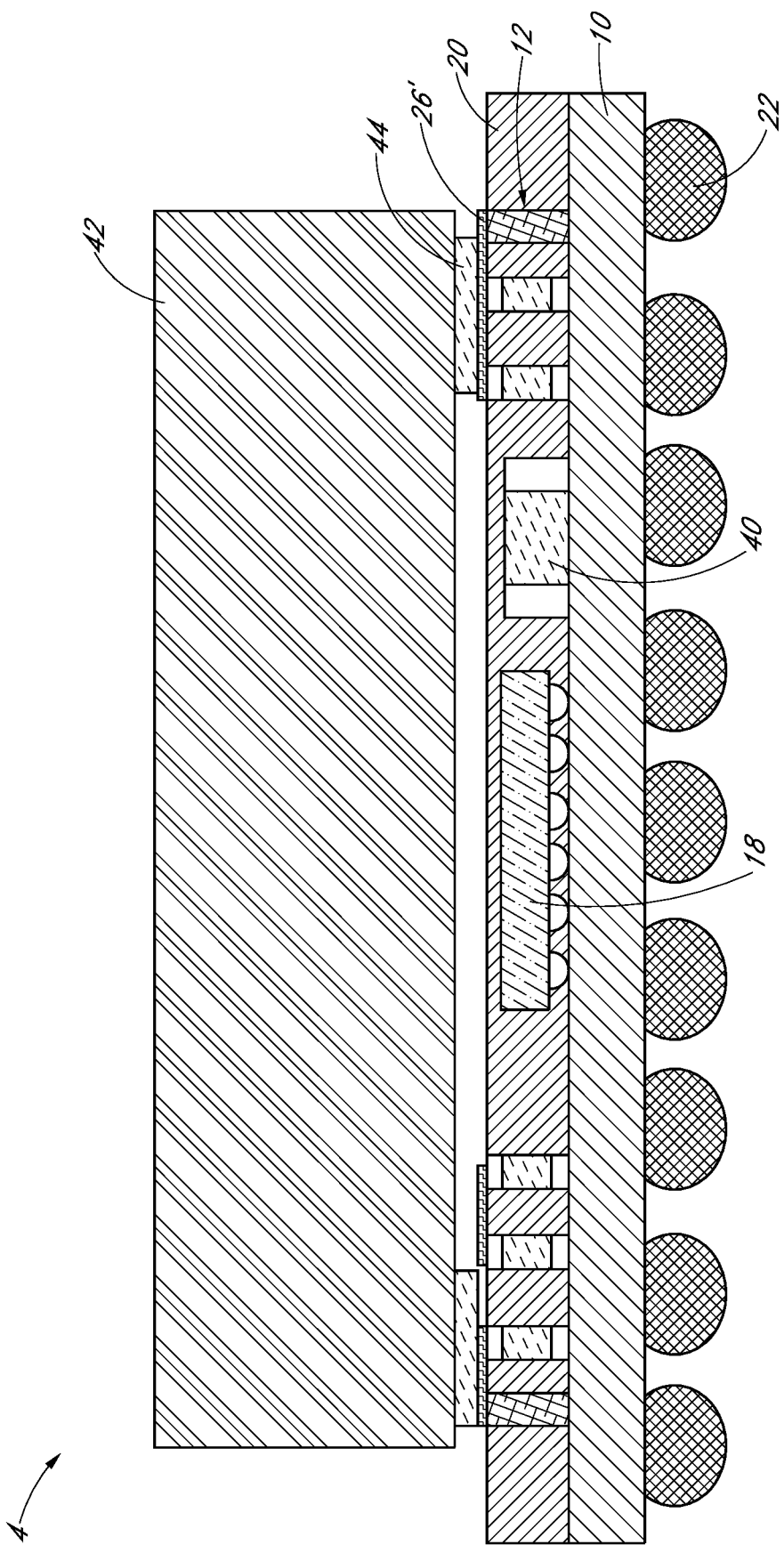
FIG. 6 is a schematic side cross-sectional view of a package according to another embodiment.

FIG. 6 is a schematic side cross-sectional view of a package 4 according to one embodiment. The package 4 is generally similar to the package 2 illustrated in FIG. 4. In the package 4, unlike the package 2, a conductive ink is illustrated as an interconnect structure 26'. In some embodiments, the conductive ink can be a solderable conductive ink. The conductive ink can be printed (e.g., screen printed) onto the molding compound 20 and over the components 12. As in the package 2, a package substrate 10 and a component 42 of package 4 can be electrically connected through at least one of a plurality of components 12, the interconnect structure 26', and a conductive adhesive 44.

FIGS. 7A and 7B are schematic side cross-sectional views of electronic assemblies 5, 5' that have a package-on-package configuration. The assembly 5 illustrated in FIG. 7A can include a lower package 6*a* and an upper package 7 that is stacked over the lower package 6*a*. The package 5' illustrated in FIG. 7B can include a lower package 6*b* and an upper package 7 that is stacked over the lower package 6*b*.

The lower packages 6*a* and 6*b* can include a package substrate 10 having a top side 10*a*, a bottom side 10*b*, a plurality of components 12 that are vertically mounted on the top side 10*a* of the package substrate 10, a die 18 mounted on the top side 10*a* of the package substrate 10, a horizontally mounted component 40, and a molding material 20 that is disposed over the top side 10a of the package substrate 10. The lower packages 6a and 6b can also include a plurality of solder balls 22 for electrically and/or mechanically connecting the package 3 to, for example, a substrate or a device (not illustrated). The plurality of components 12 can be coupled bay way of an interconnect structure 26, 26' as explained above. In FIG. 7A, a conductive ink can be applied over the molding compound 20 and the upper ends of the components 12 to serve as the interconnect structure 26'. In FIG. 7B, a metal slug is provided as the interconnect structure 26.

The upper package 7 can include a substrate 60, a plurality of electrical components 62 mounted on the substrate 60, and an overmold 54, which may be similar to or the same as the molding material 20. The lower package 6a, 6b and the upper package 7 can be electrically connected to one another. For example, the conductive structures 26, 26' can be electrically coupled to the substrate 60 by way of a conductive adhesive 44. The package substrate 10 of the lower package 6a, 6b and the substrate 60 of the upper package 7 can be electrically connected through at least one of the plurality of components 12, the interconnect structure 26', 26, and a conductive adhesive 44.

The molding material 20 of the lower package 6a, 6b can be mechanically or physically adhered to the substrate 60 of the upper package 7 by way of an adhesive 50. The adhesive 50 can comprise any suitable type of conductive or non-conductive adhesive. For example, the adhesive 50 can comprise a non-conductive adhesive glue or a dummy solder joint.

In some embodiments, one or more of the plurality of electrical components 65 of the upper package 7 can be vertically mounted on the substrate 60, in a manner similar to any of the packages disclosed herein. In such embodiments, any suitable principles and advantages disclosed herein regarding vertically stacked components can be utilized in the upper package 7. Though there are only two packages (e.g., the lower package 6a, 6b and the upper package 7) illustrated herein, three or more packages can be vertically stacked on top of one another.

Figure 8B:
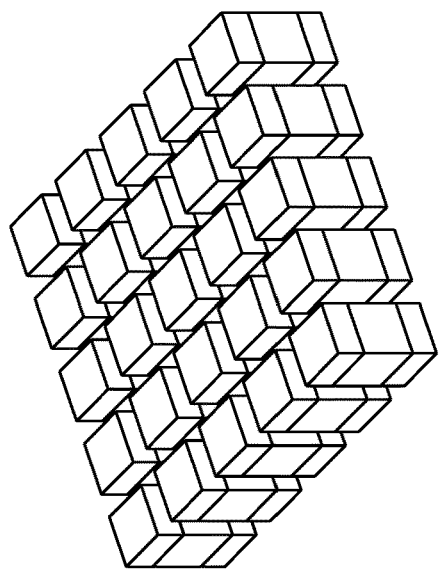
FIG. 8B is a schematic perspective view of a plurality of spaced-apart electrical components that are vertically arranged on a plane.
Figure 8A:
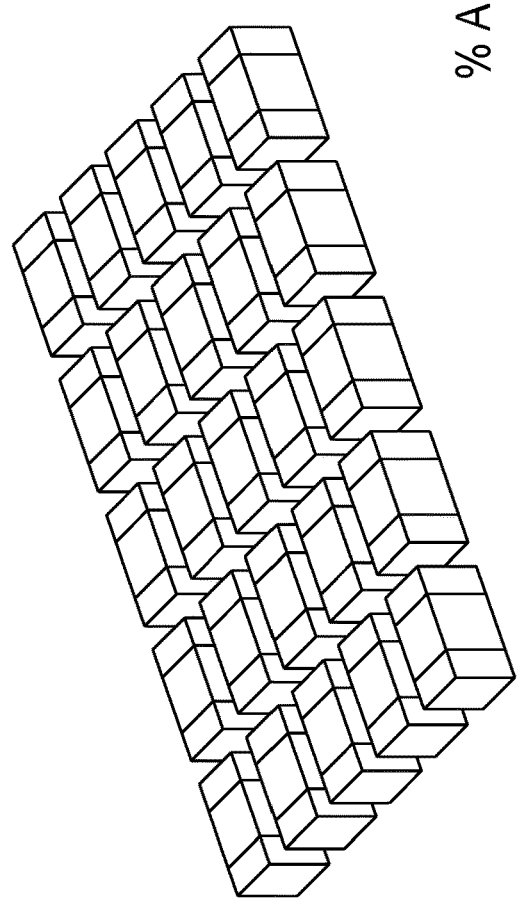
FIG. 8A is a schematic perspective view of a plurality of spaced-apart electrical components that are horizontally arranged on a plane.

FIG. 8A illustrates a schematic perspective view of a plurality of electrical components (e.g., twenty-five (25) evenly spaced, identical electrical components) that are horizontally arranged on a plane, in a manner similar to how the components could be mounted to a package substrate. In the horizontal arrangement illustrated in FIG. 8A, the example plane has a length of 3.5 mm and a width of 2 mm. The plane in FIG. 8A thus has an area of 7 mm². FIG. 8B illustrates a schematic perspective view of a plurality of electrical components (e.g., twenty-five (25) evenly spaced, identical electrical components) that are vertically arranged on the plane. The spacings between each electrical component in FIG. 8A and FIG. 8B are the same. In the vertical arrangement illustrated in FIG. 8B, the example plane has a length of 2.15 mm and a width of 2 mm. The plane in FIG. 8B has an area of 4.3 mm². Therefore, the vertical arrangement can beneficially reduce the area by about 39%. Therefore, the principles and advantages disclosed herein can beneficially reduce footprint or lateral size of a package that includes a plurality of components, and/or enable the package to densely arrange the plurality of components, so as to enable the package to fit within small form-factor electronic devices and systems.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. A package comprising:
  a substrate;
  an electrical component vertically mounted to the substrate, the electrical component having a longitudinal dimension, a transverse dimension generally perpendicular to the longitudinal dimension, a first end portion, a second end portion vertically spaced from the first portion along the longitudinal dimension of the electrical component, and a side wall extending from the first end portion to the second end portion, the first end portion having a first polarity and positioned between the substrate and the second end portion of the electrical component, the second end portion having a second polarity, the longitudinal dimension being greater than the transverse dimension; and a molding material disposed at least partially along the side wall of the electrical component.

2. The package of claim 1, wherein the longitudinal dimension of the electrical component is at least twice as long as the transverse dimension of the electrical component.

3. The package of claim 1, further comprising a second component mounted to the substrate.

4. The package of claim 3, wherein the second component is vertically mounted to the substrate, the second component having a third end portion and a fourth end portion vertically spaced from the third end portion, the third end portion of the second component is positioned between the substrate and the fourth end portion of the second component.

5. The package of claim 4, further comprising an interconnect structure electrically connecting the second portion of the electrical component and the fourth portion of the second component.

6. The package of claim 5, wherein the interconnect structure comprises a conductive ink.

7. The package of claim 5, further comprising a third component electrically coupled to the substrate by way of the electrical component and the interconnect structure.

8. The package of claim 3, wherein the second component comprises an integrated device die.

9. The package of claim 3, wherein the substrate comprises an electrical pathway that electrically couples the electrical component and the second component.

10. The package of claim 1, further comprising a second component mounted over the electrical component, the second component being in electrical communication with the substrate through the electrical component.

11. The package of claim 1, wherein the substrate comprises a printed circuit board.

12. A package comprising:
a substrate;
a first component vertically mounted to the substrate, the first component having a long side, a short side shorter than the long side, a first end portion, and a second end portion vertically spaced from the first end portion along the long side, the first end portion of the first component mounted to the substrate and positioned between the substrate and the second end portion of the component;
a second component vertically mounted to the substrate, the second component having a third end portion and a fourth end portion vertically spaced from the third end portion, the third end portion of the second component mounted to the substrate and positioned between the substrate and the fourth end portion of the second component; and
an interconnect structure electrically connecting the second portion of the first component and the fourth portion of the second component.

13. The package of claim 12, wherein the interconnect structure is arranged so as to provide lateral electrical connection between the first component and the second component.

14. The package of claim 12, wherein the interconnect structure comprises a conductive ink.

15. The package of claim 12, wherein the interconnect structure comprises a passive device.

16. The package of claim 12, further comprising a molding material disposed at least partially between a first side wall of the first component extending from the first end portion to the second end portion and a second side wall of the second component extending from the third end portion to the fourth end portion.

17. The package of claim 12, wherein the first component comprises a passive component that has a positive terminal and a negative terminal.

18. A package comprising:
a substrate; and
an electrical routing means for providing an electrical pathway between a first portion of the substrate and a second portion of the substrate, the electrical routing means comprising:
a first component vertically mounted to the first portion of the substrate, the first component having a long side, a short side generally perpendicular with the long side, a first terminal, and a second terminal spaced along the long side, the long side of the first component having a dimension greater than the shorter side of the first component, the first component configured to provide a first vertical electrical path from the first portion of the substrate through the first terminal to the second terminal along the long side of the first component;
a second component vertically mounted to the second portion of the substrate, the second component having a long side, a short side generally perpendicular with the long side, a third terminal, and a fourth terminal spaced along the long side, the long side of the second component having a dimension greater than the short side of second component, the second component configured to provide a second vertical electrical path from the fourth terminal through the third terminal to the second portion of the substrate along the long side of the second component; and
an interconnect electrically coupling the second terminal of the first component and the fourth terminal of the second component, the interconnect configured to provide a lateral electrical path between the first component and the second component.

19. The package of claim 18, wherein the first component comprises a passive component, and the first terminal and the second terminal has opposite polarities.

20. The package of claim 18, further comprising a molding material disposed at least partially between the first component and the second component.

* * * * *